United States Patent
Kuhn

(10) Patent No.: US 10,512,156 B2
(45) Date of Patent: Dec. 17, 2019

(54) ELECTRONIC DEVICE

(71) Applicant: Robert Bosch GmbH, Stuttgart (DE)

(72) Inventor: Jochen Kuhn, Bad Urach (DE)

(73) Assignee: Robert Bosch GmbH, Stuttgart (DE)

(*) Notice: Subject to any disclaimer, the term of this patent is extended or adjusted under 35 U.S.C. 154(b) by 318 days.

(21) Appl. No.: 15/562,694

(22) PCT Filed: Mar. 11, 2016

(86) PCT No.: PCT/EP2016/055241
§ 371 (c)(1),
(2) Date: Sep. 28, 2017

(87) PCT Pub. No.: WO2016/156011
PCT Pub. Date: Oct. 6, 2016

(65) Prior Publication Data
US 2018/0063945 A1    Mar. 1, 2018

(30) Foreign Application Priority Data
Mar. 30, 2015    (DE) ......................... 10 2015 205 700

(51) Int. Cl.
*H02H 9/00* (2006.01)
*H05K 1/02* (2006.01)
(Continued)

(52) U.S. Cl.
CPC ......... *H05K 1/0259* (2013.01); *H01R 12/712* (2013.01); *H01R 13/6485* (2013.01);
(Continued)

(58) Field of Classification Search
None
See application file for complete search history.

(56) References Cited

U.S. PATENT DOCUMENTS

| | | | | |
|---|---|---|---|---|
| 4,477,857 A | * | 10/1984 | Crocker | H01H 85/44 361/104 |
| 4,733,325 A | * | 3/1988 | Loesch | H01T 4/06 337/32 |
| 4,821,320 A | * | 4/1989 | Andert | A61N 1/14 361/212 |
| 5,021,734 A | * | 6/1991 | Tuttle | G01R 31/001 324/537 |

(Continued)

FOREIGN PATENT DOCUMENTS

| | | |
|---|---|---|
| CN | 201289937 Y | 8/2009 |
| CN | 103379723 A | 10/2013 |

(Continued)

OTHER PUBLICATIONS

International Search Report for Application No. PCT/EP2016/055241 dated May 31, 2016 (English Translation, 3 pages).

*Primary Examiner* — Stephen W Jackson
(74) *Attorney, Agent, or Firm* — Michael Best & Friedrich LLP

(57) ABSTRACT

The invention relates to an electronic device, in particular a control device, having a housing. The housing has a cavity, in which there is arranged a circuit carrier fitted with electric and/or electronic components, forming an electric and/or electronic circuit. Furthermore, the electronic device has a fuse element making contact with the circuit carrier in order to protect the electric and/or electronic circuit against electrostatic discharges. In addition, the electric and/or electronic circuit comprises a plug contact which has connecting pins, and the connecting pins make contact with the circuit carrier. Here, the at least one connecting pin is formed as the fuse element, in that the at least one connecting pin is connected to a ground line. Furthermore, an extremely small distance of the housing from an electrically conductive region of the electronic and/or electronic circuit is provided at a point of the at least one connecting pin formed as a fuse (Continued)

element, by which means, in the event of an electrostatic discharge, a preferred discharge path is formed between the housing and the ground line.

10 Claims, 3 Drawing Sheets

(51) Int. Cl.
*H01R 13/648* (2006.01)
*H01R 12/71* (2011.01)
*H01R 13/696* (2011.01)
*H02H 9/04* (2006.01)
*H05K 7/14* (2006.01)

(52) U.S. Cl.
CPC ............. *H01R 13/696* (2013.01); *H02H 9/04* (2013.01); *H05K 7/1427* (2013.01)

(56) References Cited

U.S. PATENT DOCUMENTS

| | | | |
|---|---|---|---|
| 5,029,041 A * | 7/1991 | Robinson | H01T 4/08 |
| | | | 361/212 |
| 5,671,123 A | 9/1997 | Omori et al. | |
| 6,064,292 A * | 5/2000 | Pongracz | H01H 9/12 |
| | | | 337/199 |
| 7,193,834 B2 * | 3/2007 | Oh | H01R 13/6485 |
| | | | 361/212 |
| 2006/0108637 A1 | 5/2006 | Kuzmenka | |
| 2009/0251843 A1 | 10/2009 | Hironaka | |

FOREIGN PATENT DOCUMENTS

| | | |
|---|---|---|
| DE | 10065019 | 8/2001 |
| DE | 102004049053 | 5/2005 |
| DE | 102005053689 | 6/2006 |
| DE | 112007001369 | 4/2009 |
| DE | 102010040558 | 3/2012 |
| JP | 2007214061 | 8/2007 |

\* cited by examiner

ELECTRONIC DEVICE

BACKGROUND OF THE INVENTION

The invention relates to an electronic device, in particular a control device, having a housing, which has a cavity, in which there is arranged a circuit carrier fitted with electric and/or electronic components, forming an electric and/or electronic circuit, and having a fuse element making contact with the circuit carrier in order to protect the electric and/or electronic circuit against electrostatic discharges.

Electronic devices comprise electric and/or electronic circuits, which are very sensitive with regard to an electrostatic discharge. An electrostatic discharge can result for a variety of reasons. For example, it is possible that housing parts—for example made from plastic—charge themselves electrostatically. From a certain amount of charge, the electrostatic charge can then jump from the housing onto electrically conductive regions of the electric and/or electronic circuit. It is likewise possible for the electronic device to move into the proximity or in contact with a charge carrying element. It is fundamentally sufficient that a potential difference is present between the electronic device and the further element. In this case, a charge transfer onto the housing of the electronic device can occur, wherein the discharge in turn can move to the electric and/or electronic circuit if a sufficient amount of charge is present. Electrostatic discharges can often damage the electric circuit and/or components of the electric and/or electronic circuit. At the point in time of the electrostatic discharge, operational disruptions of the electronic device can, however, at least occur.

The tolerance with respect to an electrostatic discharge can be checked in electronic devices by special testing methods. In such testing methods, electronic devices, for example control devices, are, for example, subjected to a discharge of air generated by a device in the immediate proximity of the housing wall thereof. In the published German patent application DE 102010040558, such testing methods are, for example, described. A control device comprising a high impedance circuit part on a printed circuit board is likewise known from said published patent application. In order to protect the high impedance circuit part an additional protection element is provided on the printed circuit board, said protection element being connected to ground. In this case, the course of an electric field elicited by an electrostatic discharge outside of the control device is deflected to the protection element. Installation space on the printed circuit board must be put aside for the additional protection element.

In the case of a control device, it is likewise known to design an additional protection element in the form of a spring. Such a spring can then contact an electric and/or electronic circuit on a printed circuit board by means of one end, in particular a ground connection. By means of the other end, the spring contacts on the other hand a housing part of the control device, for example a metallic cover. An electrostatic discharge is always ensured via the spring on account of the direct contact. Such a spring however requires a large area on the printed circuit board layout. Furthermore, the metallic cover must be mechanically fixed to the control device during installation. This is because the spring presses the cover upwards due to the return force thereof. If the cover is, for example, adhesively sealed, the mechanical fixation of the cover must take place until the adhesive has completely cured.

A conductor support is known from the published German patent application DE 102004049053 A1, which has at least one spark route for surge protection between two electric, conductive regions on the conductor support. Such spark routes can be structured on the printed circuit board using conventional etching methods and are suitable for the formation of an electrostatic protection for connecting pins.

SUMMARY OF THE INVENTION

The aim underlying the invention is to provide a simple and cost effective electrostatic protection for an electronic device.

The invention relates to an electronic device, in particular a control device, having a housing. The housing has a cavity, in which there is arranged a circuit carrier fitted with electric and/or electronic components, forming an electric and/or electronic circuit. Furthermore, the electronic device has a fuse element making contact with the circuit carrier in order to protect the electric and/or electronic circuit against electrostatic discharges. In addition, the electric and/or electronic circuit comprises a plug contact which has connecting pins, and the connecting pins make contact with the circuit carrier. At least one connecting pin is formed as the fuse element, in that the at least one connecting pin is connected to a ground line. Furthermore, an extremely small distance of the housing from an electrically conductive region of the electric and/or electronic circuit is provided at a point of the at least one connecting pin formed as the fuse element, by which means, in the event of an electrostatic discharge, a preferred discharge path is formed between the housing and the ground line. In an advantageous manner, a component already contained in the electric and/or electronic circuit, namely the plug contact, takes on additionally the function of an electrostatic protection besides providing an electric and/or mechanical contacting option of the electric and/or electronic circuit, for example, by means of a current supply and/or control line. As a result, there is the great advantage that neither additional costs ensue nor does further installation space have to be provided on the circuit carrier due to the provision of an electrostatic protection according to the invention. As a result, the electric and/or electronic circuit can be effectively protected against electrostatic discharge and at the same time remain very compactly embodied. As the at least one connecting pin formed as the fuse element, that connecting pin is to be selected which is not used for the circuit function and therefore, for example, would represent an otherwise unengaged connecting pin of the plug contact. The ground connection can be in the form of a simple embodiment on the circuit carrier, for example, as a component of the electric and/or electronic circuit. Likewise in another embodiment, there is the option for the ground line to be provided by a mating plug that acts together with the plug contact, wherein the mating plug contacts the ground line when inserted into the plug contact by means of the connecting pin formed as the fuse element. In principle, the mating plug can comprise other lines, for example: current supply, test control lines or signal control lines, which then contact the other connecting pins. Accordingly, the other connecting pins of the plug contact are engaged in a defined manner for the operation and the function of the electric and/or electronic circuit in accordance with the application of the electronic device.

In an advantageous embodiment, the discharge path is led over the spark route bridging the extremely small distance. Accordingly, the discharge path has a contact-free area portion, which comprises an air gap between the housing and the at least one connecting pin formed as the fuse element. This air gap can be overcome during an electrostatic discharge by means of an air discharge, wherein a spark route completely bridges the existing air gap at the point in time of the electrostatic discharge. Due to the fact that mechanical contact is absent, the transfer of mechanical stresses from the housing to the fuse element provided in the described manner, the plug contact entirely and/or the circuit carrier is to be excluded. By means of a tolerance calculation, a minimum distance can be taken as a basis, which, also in the case of an unfavorable ensuing tolerance chain of all the dimensions which set the extremely small distance, ensures that an air gap still remains for the spark route. In the same manner, the maximally admissible air gap for forming a spark route is checked in the case of a predetermined electrostatic discharge possibility.

In an alternative embodiment, the at least one connecting pin formed as the fuse element contacts the housing. In order to prevent damage or to great of mechanical stresses, such a contacting takes place in a resilient manner. This can, for example, be achieved by at least one area portion adjoining the contact point of the at least one connecting pin formed as the fuse element, said area portion being configured in a flexible manner. In the case of connecting pins that are designed wire-shaped, such an implementation is very simple. In the case of a sufficiently long wire section, said section is enabled, when a force is applied transversely to a wire extension, to elastically deform in the direction of the applied force. Thus, the wire section can be an end of the connecting pin or be disposed between two fastened ends of the connecting pin. By virtue of the fact that the wire section and the housing are disposed at an angle in relation to one another, the elastically flexible wire section is pushed away by the housing up to a contact point, which is predetermined for the operation of the electronic device, at the instance of the formation of the contact point, for example during the installation of the electronic device.

Provision is made in a particular embodiment for the housing to have a bulge projecting into the cavity and the extremely small distance to than be formed at the bulge. In this way, it is not required that the connecting pin provided as the fuse element to have to be designed as the furthest projecting element of the electric and/or electronic circuit. In fact, the advantage results from this embodiment that an arbitrary topology or respectively a multi-sided construction of the electric and/or electronic circuit can occur. By providing the previously mentioned bulge, an accommodation of the housing in the region of the at least one connecting pin formed as the fuse element is accordingly provided in a targeted manner, such that the extremely small distance of the housing to a conductive region of the electric and/or electronic circuit is ensured exactly in said region. In an advantageous manner, a taking into account of the fuse element at an arbitrary position on the circuit carrier is thus facilitated.

A possible embodiment furthermore provides that the housing comprises at least two housing elements that form the cavity. It is thus conceivable that the one housing element is a cover and the further housing element is a base element that can be sealed by the cover. Furthermore, at least one of the housing elements, for example the cover, is designed as a cast part. In this case, the previously described bulge projecting into the cavity of the housing can easily be implemented as a correspondingly integrally formed dome attachment in the cast part. The dome attachment can have processing surfaces, for example by means of a mechanical removal, such as, for example, by means of a milling procedure. Hence, the extremely small distance can be implemented between the dome attachment and the at least one connecting pin formed as the fuse element in a narrow tolerance range. The same applies to the case of an alternative embodiment, in which one of the housing elements is designed as a sheet metal part, in particular in the form of a punched and deep-drawn part. In so doing, a recess in forming the aforementioned bulge can be very easily implemented by means of a molding die. Furthermore, the position can also if required be changed also adapted to the respective printed circuit board layout by means of an insert in the deep-drawing die. In this way, the production of different electronic devices can be held flexible. Basically one of the housing elements can be formed from a metal, wherein the other housing element is implemented from a plastic, in particular as a plastic injection-molded part.

In a very advantageous embodiment, the plug contact contained in the electric and/or electronic circuit is disposed in such a way to the circuit carrier that the connecting pins thereof are pushed through in each case with one end thereof from one side and then project from the other side of the circuit carrier. The one side of the circuit carrier can, for example, face a housing side so that even the connecting pins point to this housing side, in particular point perpendicularly to said housing side. The point of the extremely small distance is then very simply provided by the protruding end of the at least one connecting pin formed as the fuse element by, for example, the housing side additionally comprising the bulge projecting in the direction of the fuse element. Alternatively, the protruding end of the at least one connecting pin formed as the fuse element is designed longer than the respective protruding ends of the remaining connecting pins. In this way, the extremely small distance results in the simplest manner at the location of the fuse element provided.

In a preferred embodiment, the cavity in the housing is bound by housing sides and the extremely small distance is provided at an edge region of one of the housing sides. The cavity is preferably designed substantially cube-shaped. The housing sides are particularly formed by housing walls which extend laterally to the greatest extent and which are substantially at right angles to one another. The edge regions of these housing sides represent the regions of the greatest housing rigidness. Any mechanical stresses of the housing lead accordingly only to small or ideally to negligible small deformations. Thus, the once predetermined extremely small distance between the connecting pin formed as the fuse element can also be maintained during operation of the electronic device. Apart from that, such an embodiment results very simply by the plug contact being disposed in an edge region of the circuit carrier, wherein the circuit carrier is enclosed at a small distance from the housing. In so doing, a simple embodiment can be maintained in such a way that the electronic device comprises a plug contact that protrudes from the housing. In this case, the housing has an opening, through which the plug contact is led. In addition, the plug contact can then be fastened to the housing and, for example, be sealed up opposite to the opening. In this way, the electric and/or electronic circuit disposed in the housing can be contacted outside the housing, in particular by means of a current supply line and/or signal control line.

BRIEF DESCRIPTION OF THE DRAWINGS

Further advantages, features and details of the invention ensue from the following description of preferred exemplary embodiments as well as with the aid of the drawings. In the drawings.

In the figures, functionally identical components are in each case denoted with the same reference signs.

DETAILED DESCRIPTION

Figure 1:
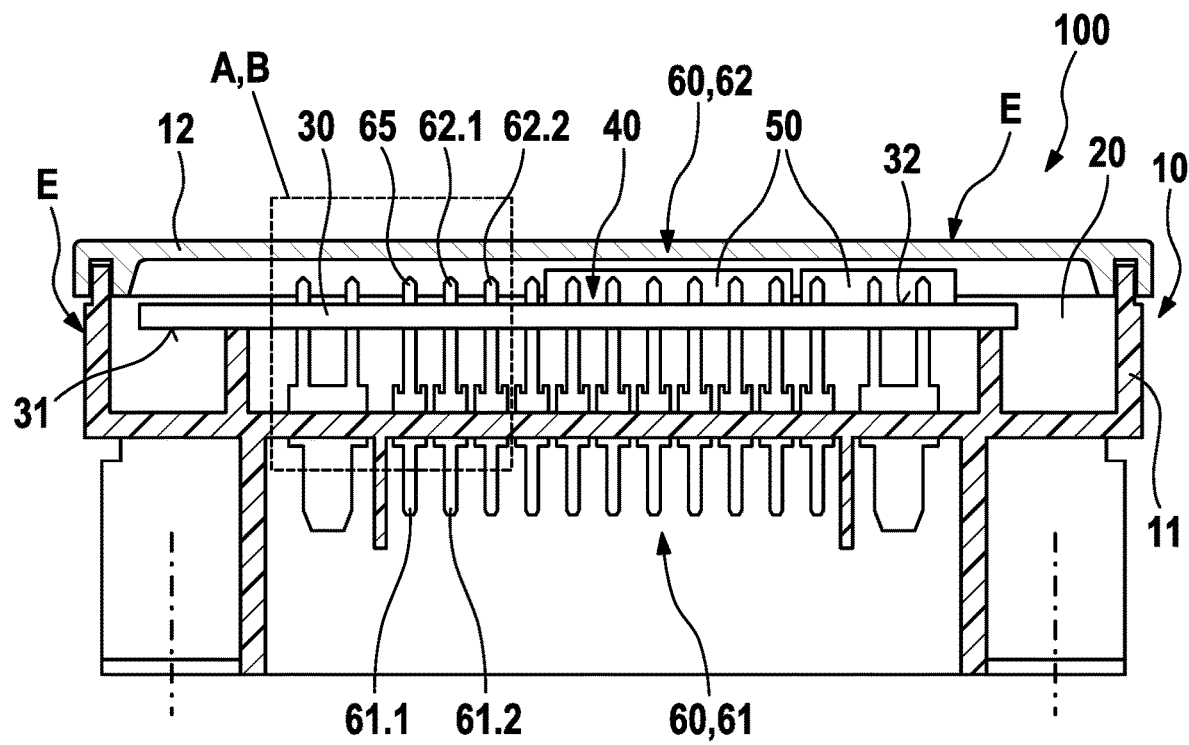
FIG. 1 shows an electronic device in a side cross-sectional view.
Figure 1:
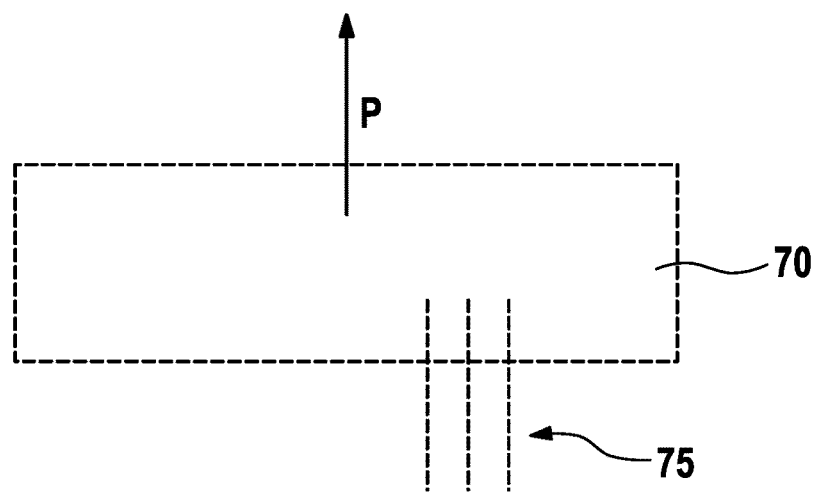

FIG. 1 shows an electronic device according to the invention in a side cross-sectional view. The electronic device 100 comprises a housing 10, which consists of a base element 11 and a cover 12. The base element 11 is, for example, formed from plastic, in particular as a plastic injection-molded part. The cover 12 is, for example, made from metal, in particular from Al or an Al alloy. The cover is thereby set on the base element 11 and fastened to the same, for example by screws or adhesives. In so doing, a cavity 20 is formed between the cover 12 and the base part 11. A circuit carrier 30 is accommodated within the cavity 20. A conductor path structure is formed (not depicted) on an upper side 32 and/or a lower side 31 of the circuit carrier 30. Furthermore, the circuit carrier 30 is fitted with an electric and/or electronic component 50. The electric and/or electronic component 50 is in turn connected to the conductor path structure, wherein an electric and/or electronic circuit 40 is formed in total on the circuit carrier 30. The electric and/or electronic circuit 40 also comprises a plug contact 60. The plug contact 60 is thereby led through a wall of the base element 11. In the case of the base element 11 being a plastic injection-molded part, the plug contact 60 can, for example, be molded into the plastic.

In total, the plug contact 60 has connecting pins 61, which are led out of the housing 10. The plug contact 60 comprises a plurality of such connecting pins 61, for example a first and a second external connecting pin 61.1, 61.2. In addition, said connecting pins are also led into the cavity 20 of the housing, wherein they are there present as internal connecting pins 62, for example as a first and a second internal connecting pin 62.1, 62.2. Said pins are pushed through the circuit carrier 30 with the respective end thereof from the bottom 31, so that they then protrude from the top side 32. Most of the internal connecting pins 62 are connected to the conductor path structure of the circuit carrier 30; thus enabling a current supply and/or also a signal control of the electric and/or electronic circuit 40 to take place via said internal connecting pins. To this end, a mating plug 70 can, for example, be applied to the plug contact 60 from the outside in a plugging direction P. The mating plug 70 makes contact with different lines 75, for example a current supply, signal control, a ground and/or a test line. The plug contact 50 furthermore has an internal connecting pin 65, which is not used for the current supply, the test or the signal control of the electric and/or electronic circuit 40 and therefore remains free in typical electronic devices. This connecting pin 65 is now formed as the fuse element for protecting the electric and/or electronic circuit in the inventive electronic device 100 against electrostatic discharges E. To this end, the connecting pin 65 formed as the fuse element is connected to a ground line. Said ground line can, for example, be formed on the circuit carrier 30 and be contacted by said connecting pin 65. The ground line can likewise be provided as one of the lines of the mating plug 70 by means of corresponding contacting of the plug contact 60.

Figure 2A:
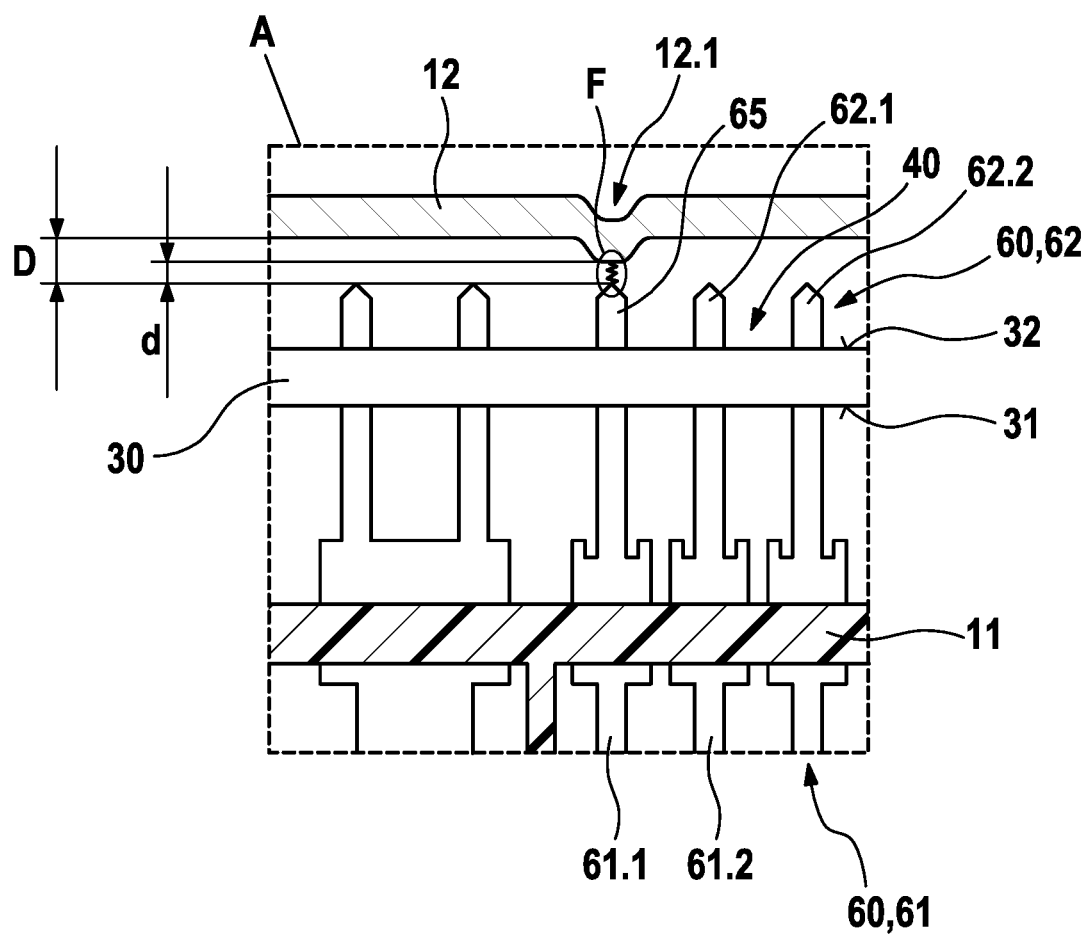
FIG. 2a shows a detailed view of a first embodiment for setting an extremely small distance between the housing and the at least one connecting pin of a plug contact; said connecting pin being formed as the fuse contact.
Figure 2B:
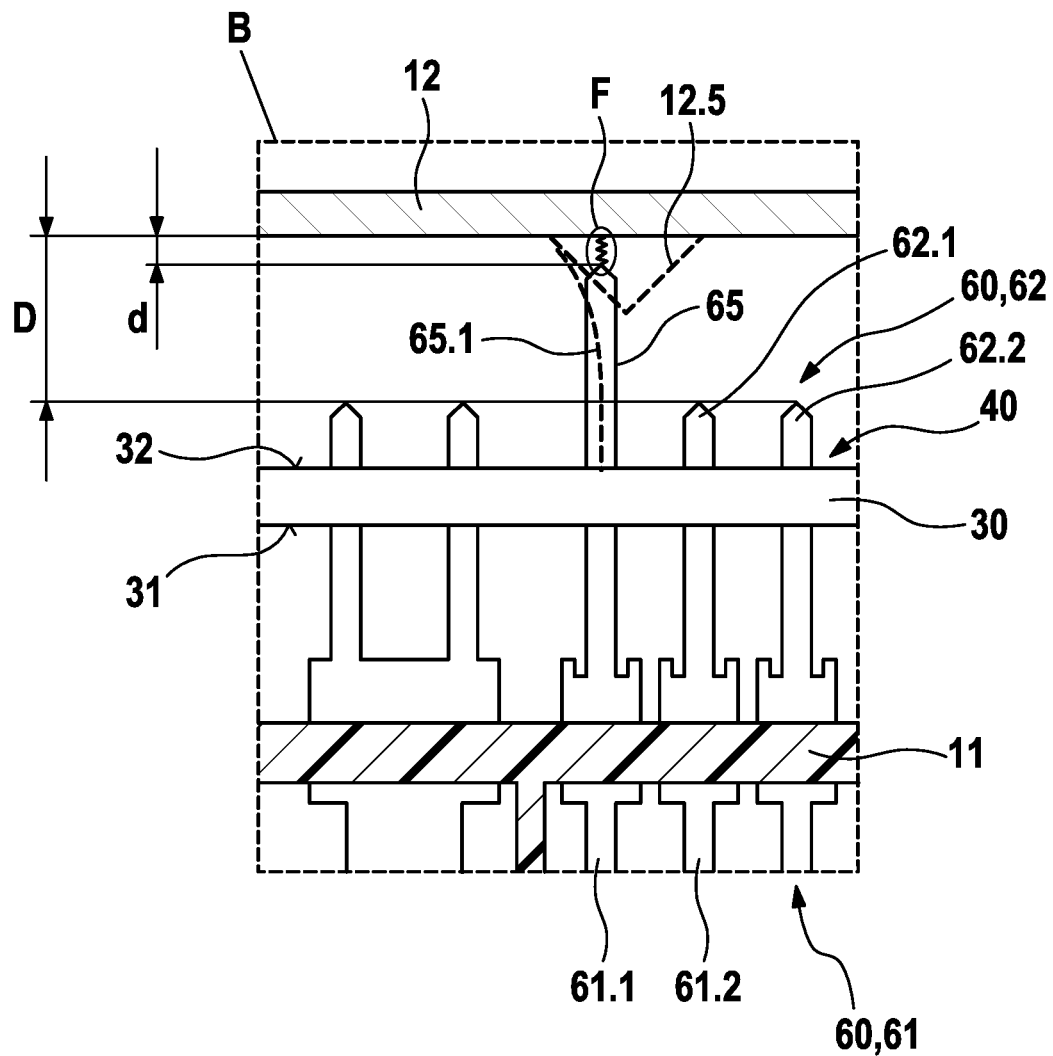
FIG. 2b shows a detailed view of a second embodiment for setting an extremely small distance between the housing and the at least one connecting pin of a plug contact, said connecting pin being formed as the fuse element.

An extract of the device 100 according to the invention is denoted by means of A and B in FIG. 1, said extract being shown in each case in FIGS. 2a and 2b in a depicted detailed view in a different embodiment. Basically FIGS. 2a and 2b show a spacing D, d of the housing 10 to conductive regions of the electric and/or electronic circuit 40. In this case, an extremely small distance d is formed at one location of the connecting pin formed as the fuse element. In comparison thereto, the other internal connecting pins 62, for example 62.1 and 62.2, as well as the conductor path structure and also the at least one electric and/or electronic component 50 have a larger distance D to the housing. Furthermore, a remaining air gap is between the connecting pin 65 formed as the fuse element and the cover 12, so that both do not make contact with one another. In the embodiment according to FIG. 2a, the extremely small distance d results by virtue of the fact that a molding 12.1 is formed in the cover 12 in the region of the connecting pin 65 formed as the fuse element, said recess accommodating the fuse element. The molding 12.1 is, for example, configured by means of a recess in a cover 12 formed as a deep-drawn part. In a similar manner, an extremely small distance d results by virtue of the fact that, in the case of a cover 12 as a cast part, the molding 12.1 is provided as an applied dome attachment. On the other hand in the embodiment according to FIG. 2b, the extremely small distance d is set as a result of the connecting pin 65 formed as the fuse element being embodied longer than the remaining internal connecting pins 62 and thus correspondingly most closely resembles the cover 12. In this embodiment, the cover 12 in total or at least in the region above the plug contact 60 can remain of flat construction.

At the point in time of a discharge E, an air discharge results at the point of the extremely small distance d in the embodiments described according to FIGS. 2a and 2b, whereby the gap present there is bypassed by a spark route F that forms. As a result, the discharge can be diverted across the ground line connected to the connecting pin 65 formed as the fuse element, and the electric and/or electronic circuit 40 is effectively protected from damage or interruption.

In FIG. 2b, still another alternative embodiment is shown in such a way that a contact point exists between the cover 12 and the connecting pin 65 formed as the fuse element when the cover is in the mounted state on the base element 11. For this purpose, an obliquely formed projection is, for example, provided in the cover, which laterally pushes away the connecting pin 65 and elastically deforms the same in the installation end position of the cover 12. In so doing, the connecting pin 12 formed as the fuse element 65 rests against the chamfer of the projection 12.5 and has a corresponding bending profile 65.1. In the case of formed internal connecting pins 62, which are configured in an angular manner between the circuit carrier 30 and the external connecting pins 61, a connecting pin 65 formed as the fuse element can, for example, be elastically deformed in this angular region by means of a comparable projection 12.5 while forming a touch contact.

Thus, the extremely small distance is provided by means of a touch contact. In this case, a discharge path of the electrostatic discharge then occurs directly above the touch contact without a spark route being formed.

The invention claimed is:

1. An electronic device (100), having a housing (10), which has a cavity (20), in which there is arranged a circuit carrier (30) fitted with electric and/or electronic components (50), forming an electric and/or electronic circuit (40), and having a fuse element (65) making contact with the circuit carrier (30) in order to protect the electric and/or electronic circuit (40) against electrostatic discharges (E), characterized in that the electric and/or electronic circuit (40) comprises a plug contact (60) which has connecting pins (61, 62) and the connecting pins (62) make contact with the circuit carrier (30), wherein at least one connecting pin (65) is formed as the fuse element, in that the at least one connecting pin (65) is connected to a ground line and an extremely small distance (d) of the housing (10) from an electrically conductive region of the electric and/or electronic circuit (40) is provided at a point of the at least one connecting pin (65) formed as the fuse element, by which means, in the event of an electrostatic discharge (E), a preferred discharge path is formed between the housing (10) and the ground line.

2. The electronic device (100) according to claim 1, characterized in that the discharge path is led across a spark route (F) which bypasses the extremely small distance (d).

3. The electronic device (100) according to claim 1, characterized in that the at least one connecting pin (65) formed as the fuse element makes contact with the housing (10).

4. The electronic device (100) according to claim 1, characterized in that the housing (10) has a bulge (12.1, 12.5) projecting into the cavity (20) and the extremely small distance (d) is formed at the bulge (12.1, 12.5).

5. The electronic device (100) according to claim 4, characterized in that the housing (10) comprises at least two housing elements (11, 12) that form the cavity (20), wherein at least one of the housing elements (11, 12) is formed as a cast part or a sheet metal part, wherein the bulge (12.1, 12.5) in the housing (10) is provided as a dome attachment in the cast part or as a recess in the sheet metal part.

6. The electronic device (100) according to claim 1, characterized in that the connecting pins (62) are in each case pushed through from one side (31) of the circuit carrier (30) with one end thereof and project from the other side (32) of the circuit carrier (30), wherein the point of the extremely small distance (d) is provided by means of the projecting end of the at least one connecting pin (65) formed as the fuse element.

7. The electronic device (100) according to claim 6, characterized in that the projecting end of the at least one connecting pin (65) formed as the fuse element is formed longer than the projecting ends of the remaining connecting pins (62).

8. The electronic device (100) according to claim 1, characterized in that the cavity (20) in the housing (10) is bounded by housing sides and the extremely small distance (d) is provided at an edge region of one of the housing sides.

9. The electronic device (100) according to claim 1, characterized in that the electronic device (100) comprises a plug contact (60) which is led out of the housing (10).

10. The electronic device (100) according to claim 1, characterized in that the at least one connecting pin (65) formed as the fuse element makes contact with the housing (10) in a resilient manner.

\* \* \* \* \*